United States Patent [19]
Sauer

[11] Patent Number: 5,414,388
[45] Date of Patent: May 9, 1995

[54] RAIL TO RAIL OPERATIONAL AMPLIFIER INPUT STAGE

[75] Inventor: Don R. Sauer, San Jose, Calif.

[73] Assignee: National Semiconductor Corporation, Santa Clara, Calif.

[21] Appl. No.: 205,530

[22] Filed: Mar. 3, 1994

[51] Int. Cl.$^6$ .............................................. H03F 3/45
[52] U.S. Cl. ..................................... 330/252; 330/261
[58] Field of Search ............... 330/252, 255, 258, 261; 307/567

[56] References Cited

U.S. PATENT DOCUMENTS

| | | | |
|---|---|---|---|
| 4,532,479 | 7/1985 | Blauschild | 330/261 |
| 4,555,673 | 11/1985 | Huijsing et al. | 330/258 |
| 5,153,529 | 10/1992 | Koda et al. | 330/261 X |

Primary Examiner—Steven Mottola
Attorney, Agent, or Firm—H. Donald Nelson; Stephen R. Robinson; Limbach & Limbach

[57] ABSTRACT

An op-amp incorporates an input stage composed of two complementary long-tailed transistor pairs driven in parallel from the input terminals. A bias supply circuit provides the tail currents which are proportioned so that the total tail current adds up to a constant sum. The bias circuit proportions the tail currents, relative to the common mode voltage, so that at least one long tailed pair will function even when the common mode is driven to the supply rail potential. The bias supply current includes cascode connected transistors to provide the tail currents and the input circuit includes active clamping transistors.

5 Claims, 2 Drawing Sheets

RAIL TO RAIL OPERATIONAL AMPLIFIER INPUT STAGE

TECHNICAL FIELD OF THE INVENTION

The present invention relates to operational amplifier input stages and, in particular, to an operational amplifier input stage which goes rail-to-tail while providing common-mode rejection and an improved slew rate.

BACKGROUND OF THE INVENTION

Input voltage operation of an operational amplifier (op-amp) which can span rail-to-rail power supply potentials increases the useful range of input voltages over which the op-amp can operate. This is particularly useful for applications which have relatively low power supply rail potentials, such as hand-held electronic devices like cellular telephones and pagers.

Furthermore, providing the rejection of common-mode voltages that completely span the power supply rail potentials also contributes to the useful range of the op-amp. An op-amp must have extremely good common mode rejection in order to amplify a small differential voltage riding on a proportionally larger common-mode signal, while rejecting variations in the common-mode signal.

FIG. 1 shows a conventional op-amp input stage 12 which has been used to achieve the desired input voltage range and common-mode rejection range. A $V_{cc}$ power supply is connected + to a first terminal 10 and − to a ground terminal 11 to form the positive and negative supply rails. While a single $V_{cc}$ power supply is shown connected between the first terminal 10 and the ground terminal 11, double positive and negative supplies could be used. In the case of double positive and negative supplies, the midpoint of the two supplies would be considered the ground level.

An input stage 12 has negative and positive differential voltage input terminals 13 and 14 connected to the bases of first and second NPN differential transistors 20, 21, respectively, and to the bases of first and second PNP differential transistors 22, 23, respectively. That is, first and second NPN transistors 20, 21 and first and second PNP transistors 22, 23, are complementary long-tailed transistor pairs having commonly connected inputs.

The input stage input currents, from the collectors of the first and second NPN transistors 20, 21 or from the collectors of the first and second PNP transistors 22, 23 are combined in a dual-sided current subtractor 15. The dual-sided current subtractor 15 is shown in block form. One example of a dual-sided current subtractor may be found in a co-pending patent application, entitled RAIL TO RAIL OPERATIONAL AMPLIFIER INTERMEDIATE STAGE, Ser. No. 08/205,573, filed on even date herewith. In its basic form, first, second, and third subtractors 16, 17 and 18 of the dual-sided current subtractor 15 combine the input stage input currents to provide an input stage output current at terminal 19 that is a linear function of the differential input signal voltage at terminals 13 and 14. Thus, the input stage is a differential transconductance amplifier.

Back-to-back clamp diodes 27, 28 may be coupled between the bases of the NPN transistor pair 20, 21 and between the bases of the PNP transistor pair 22, 23 to limit the differential input drive to a peak-to-peak value of two diode drops. If the diodes 27, 28 are included, a pair of resistors 25, 26 are also included to couple the transistor bases to the input terminals 13 and 14 to isolate diodes 27 and 28 from the input terminals 13 and 14.

A bias circuit 24 sinks a tail current $I_3$ for the NPN transistor pair 20, 21 and sources a tail current $I_2$ to the PNP transistor pair 22, 23. This tail current control allows input stage operation over a common-mode input voltage range which is the power supply rail-to-rail.

The bias circuit 24, which will be discussed in detail below, proportions the input stage tail currents $I_2$, $I_3$ in accordance with the common mode input voltage. That is, when the common mode voltage is midway between the positive and negative supply rails, the tail currents are equal. As the common mode voltage swings lower, the tail current $I_3$ decreases while the tail current $I_2$ proportionately increases. When the common mode voltage falls close to the ground rail, transistors 20 and 21 cease to function as a differential pair, and the tail current $I_2$ is double what it is when the common mode voltage is midway between the positive and negative supply rails. Thus, the input stage functions normally even when the common mode voltage is close to the negative supply rail.

Conversely, as the common mode voltage swings up toward the positive supply rail, the tail-current $I_2$ decreases while the tail current $I_3$ rises proportionately. As the common mode nears the positive supply rail, and transistors 22 and 23 cease to function as a differential pair, and the tail current $I_3$ is double what it is when the common mode voltage is midway between the positive and negative supply rails. Thus, even when the common mode voltage is close to the positive supply rail, the input stage operates normally.

Put simply, the bias circuit 24 proportions the input stage tail currents $I_2$, $I_3$ as a function of common mode voltage, thereby maintaining constant transconductance even when the common mode voltage approaches either power supply rail.

The bias circuit 24 details are as follows. In the top half of bias circuit 24, PNP transistor 29 forms a current mirror with PNP transistor 30. A constant current source 31 passes a current $I_1$, which flows in the collector of transistor 29 and in a resistor 32. While the current source 31 is also connected through resistor 32 to the bases of transistors 29 and 30, and to the base of a transistor 33, the base currents are negligible and are therefore disregarded.

The transistor 30 sources a current that is connected to the emitter of the transistor 33, which is usually off, and $I_2$ (the current sourced by the PNP input transistor tail 22, 23). That is, because the current through transistor 29 is $I_1$, and PNP input transistor 30 is part of a current mirror, the current through transistor 30 is also $I_1$.

In the bottom half of the bias circuit 24, NPN transistor 34, current mirror transistor 35, series resistor 36 and NPN control transistor 37 are connected in a complementary fashion to the components in the top half of the bias circuit 24. That is, the current mirror transistor 35 sinks the NPN-transistor pair 20, 21 tail current $I_3$, and a current $I_{37}$ in NPN transistor 37. $I_{37}$ in transistor 29, which is usually off. Transistor 34 receives $I_{33}$, a current in PNP transistor 33. Put simply, the top-half bias circuit current mirror 29, 30 and the bottom-half bias circuit current mirror 34, 35 are cross-coupled through transistors 33 and 37.

When the common mode input voltage is at the rail-to-rail midpoint, $I_2=I_3$ and both the transistor 33 and the transistor 37 are off. Due to the cross connections, $I_2+I_3$ is a constant that is determined by $I_1$. When $I_2$ rises, $I_3$ is reduced proportionately, and vice versa.

While the circuit of FIG. 1 extends the input common voltage range, it has the problem that when the input voltage at the positive input terminal 14 swings above the power supply rail $V_{cc}$ or below the power supply rail ground, the second NPN transistor, which in normal operation has an inverting output, becomes overdriven. In this overdriven state, the NPN transistor's collector-base parasitic diode outputs a non-inverting signal, and this non-inverting signal causes a phase reversal in the resultant collector current.

A further problem with the circuit of FIG. 1 is that substantially the full power supply voltage will be encountered at the emitters of the PNP transistors 30, and 37 over the rail-to-rail common mode input operating range. This problem can be addressed by using lateral geometry PNP transistors, which will not Zener. However, lateral geometry transistors are much slower than vertical geometry transistors.

Additionally, as the collector voltage of the transistors 30 and 35 reaches the supply rails, the collector impedance values of the transistors 30, 35 fall off due to the variance of $V_{BE}$ with collector-to-emitter voltage. This fall-off of collector impedance is known in the art as the Early effect and is discussed, for example, in Horowitz and Hill, *The Art of Electronics*. This Early-effect impedance value fall-off can potentially cause the tail currents $I_2$ and $I_3$ to be modulated.

SUMMARY OF THE INVENTION

The present invention provides a rail-to-rail operational amplifier input stage which includes a bias circuit capable of maintaining a constant stage transconductance over the common mode voltage range. The rail-to-rail operational amplifier input stage actively clamps the common-mode input voltage well beyond a two-diode common mode input voltage range. The rail-to-rail operational amplifier further provides an increased slew rate.

These and other objects are achieved as follows. The input stage is composed of a complementary pair of long-tailed transistor pairs with a bias circuit providing two tail currents. The bias circuit provides tail current control by proportioning the tail currents so that the input stage transconductance is held constant as a function of the common mode voltage.

As the common mode voltage rises toward the positive rail, the tail current in the NPN transistors increases and the PNP transistors tail current proportionately decreases. As the common mode voltage approaches the lower rail, the tail current in the NPN transistors decreases and the PNP transistors tail current increases proportionately. The bias circuit includes cascode-connected source and sink transistors which increase the source and sink impedances. Furthermore, the cascode-connected source and sink transistors do not encounter the full supply voltage over the input common mode voltage range, and all emitters are buffered from the full supply voltage.

The input stage transistors include active emitter follower clamp transistors which act dynamically to clamp the differential input voltage when the common-mode voltage range swings throughout the rail-to-rail range.

A better understanding of the features and advantages of the invention will be obtained by reference to the following detailed description and accompanying drawings which set forth an illustrative embodiment in which the principles of the invention are utilized.

DESCRIPTION OF THE INVENTION

Figure 1:
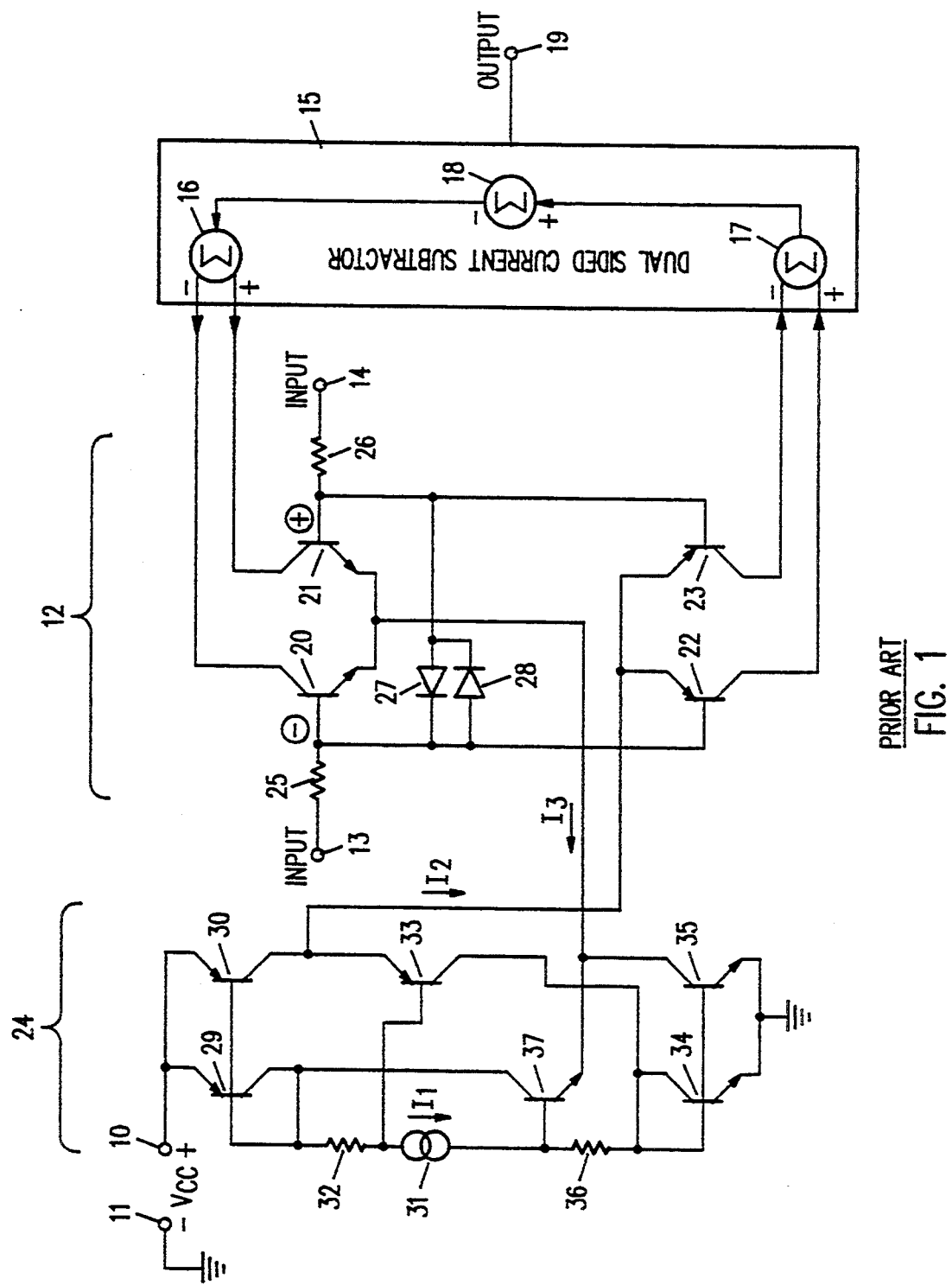
FIG. 1 is a schematic-block diagram illustrating a conventional prior art rail to rail operational amplifier input stage and bias circuit.

The invention will now be described with reference to FIG. 2. Where the components are the same as those of FIG. 1, they are given the same designations.

In the input stage 12, clamp diodes 27 and 28 of the conventional input stage may be replaced with active emitter follower NPN clamp transistors 40 and 41, respectively.

NPN clamp transistor 40 has its base connected to the base of NPN input transistor 20 and its emitter connected to the base of NPN input transistor 21. The collector of NPN clamp transistor 40 is coupled to the collector of transistor 20. Alternatively, the collector of transistor 40 could be connected to the $+V_{cc}$ rail. When the base of transistor 21 sinks to one diode below the base of transistor 20 (i.e. the differential input voltage is greater than one diode drop), transistor 40 will conduct, thus clamping the voltage across the input transistors 20, 21.

Likewise, PNP transistor 41 has its base connected to the base of transistor 22 and PNP transistor 41 has its emitter connected to the base of transistor 23. The collector of PNP transistor 41 is coupled to the collector of transistor 22. Alternatively, the collector of transistor 41 could be connected to the negative supply rail. PNP transistor 41 acts as an emitter follower when the base voltage of transistor 23 rises to one diode above the base voltage of transistor 22. That is, transistor 41 provides clamping for the opposite differential swing than transistor 40, complementing the clamping action of transistor 40.

When the differential input is below one diode, neither transistor 40 nor transistor 41 will be operative.

It is significant that the input 14 is the $+$input rather than the $-$input because the input 14 is connected to the emitter of the transistor 40. That is, since there is no emitter-base parasitic diode, the emitter of transistor 40 follows the $+$input when it goes below the rail. Thus, there will be no phase reversal in the resultant collector current.

The transistor clamping arrangement of the present invention provides an advantage over the diode clamping arrangement of the conventional op-amp input stage in that the collector currents from the clamp transistors 40, 41 are fed back into the dual-sided current subtractor 15. Thus, when the inputs voltages swing above or below the power supply rails, these clamp transistor collector currents overwhelm the parasitic diode collector current of the input transistors 23 and 21, thus forcing the correct polarity of the output signal at the output terminal 19.

In addition, the transistor clamping action provides a further advantage of adding signal current. Since slew rate is a function of signal current, this additional signal current increases the slew rate.

Figure 2:
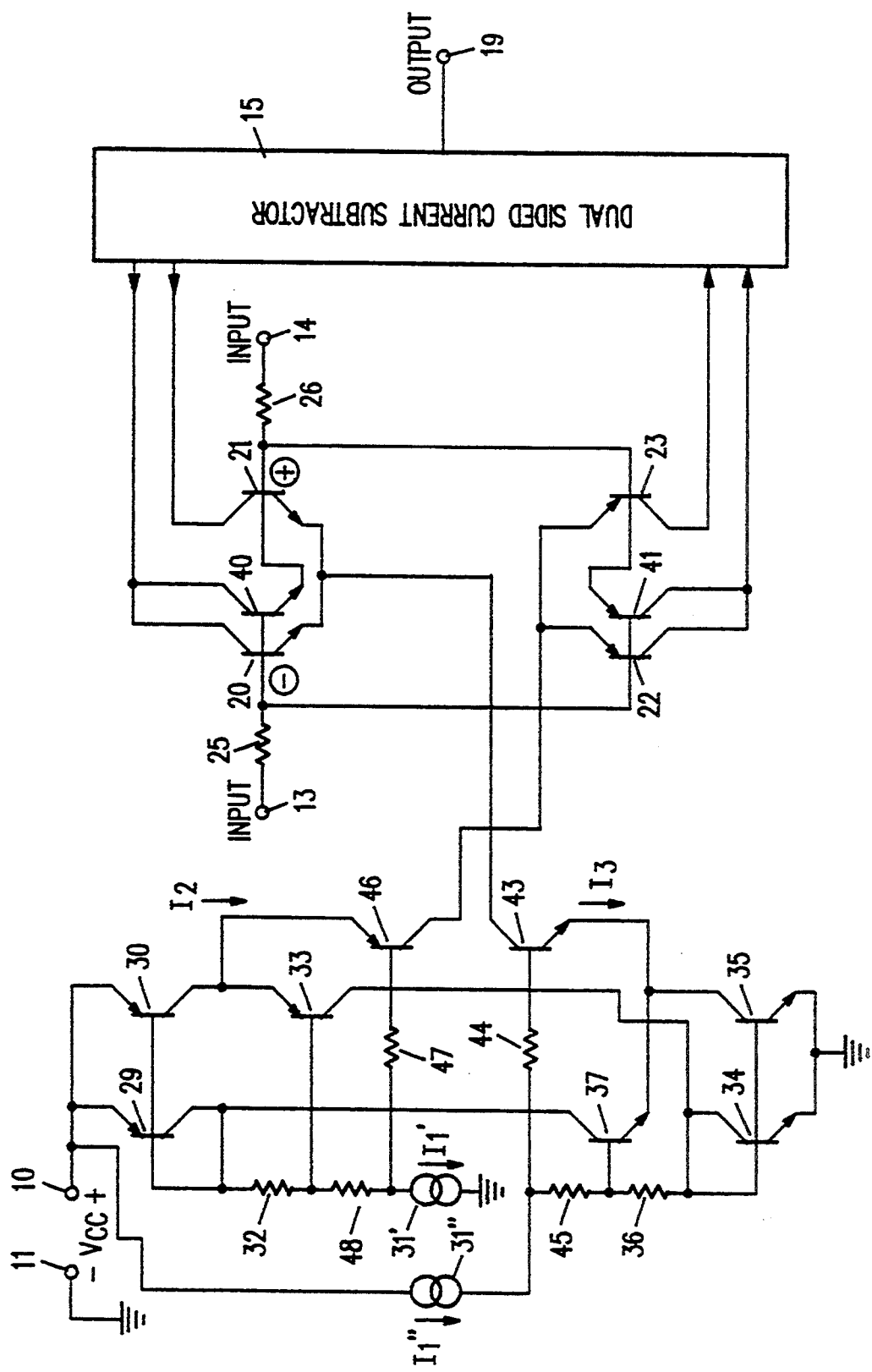
FIG. 2 is a schematic diagram illustrating a rail-to-rail operational amplifier input stage in accordance with the present invention.

In the bias circuit 24 of FIG. 2, two matched current sources 31'(I') and 31"(I") provide tail current $I_3$ and $I_2$ control. First, the tail current $I_3$ is sunk by an NPN transistor 43, which is cascode connected to transistor 35. The base of transistor 43 is isolated by resistor 44. That is, the resistor 44 limits the base current of transistor 43 when it is swung close to saturation, a condition that will occur when the common mode input voltage at input terminals 13 and 14 approaches the negative supply rail. During saturation, the current of the transistor 35 is coupled through the transistor 37 to the transistor 29.

$I_1"$, with resistor 45, provides base bias to the transistor 43. The resistor 45 and the magnitude of $I"$ are chosen so that the base of transistor 43 is biased at about 125 millivolts above the base of transistor 37 so very little current flows in the transistor 37.

Likewise, PNP transistor 46 is cascode connected to transistor 30 and sources the tail current $I_2$. The base of transistor 46 is isolated from $I_1'$ and resistor 47. Resistor 47 limits the base current of transistor 48 when it is swung close to saturation, a condition that will occur when the common mode input voltage at input terminals 13 and 14 approach the positive supply rail. During saturation, the transistor 30 current is coupled through the transistor 33 to the transistor 36.

$I_1'$ and resistor 48 provide base bias to the transistor 46. The resistor 48 and the magnitude of $I'$ are chosen so that the base of transistor 46 is biased at about 125 millivolts below the base of transistor 33, so that little current flows in the transistor 33.

Thus, the cascode connected transistors 43 and 46 solve the problem of the conventional rail-to-rail op-amp input stage circuit by preventing the application of the full supply voltage to transistors 30, 33, 35 and 37. Furthermore, a high impedance is maintained for the tail currents $I_2$ and $I_3$, regardless of the common mode input voltage at terminals 13 and 14, so the tail currents are not modulated with changes in common mode input voltage.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. An operational amplifier input stage circuit having a pair of differential input terminals and positive and negative supply rails connectable to a source of operating power, said circuit comprising:
   a pair of first and second NPN transistors connected as a first long-tailed pair to employ a first tail current;
   a pair of first and second PNP transistors connected as a second long-tailed pair to employ a second tail current;
   first coupling means for coupling the base of said first transistor of said pair of NPN transistors and said first transistor of pair of PNP transistors to said first differential input terminal;
   second coupling means for coupling the base of said second transistor of said pair of NPN transistors and said second transistor of said pair of PNP transistors to said second differential input terminal;
   a biasing circuit including constant current means, first output current means for producing said first tail current, and second output current means, complementary to said first output current means, for providing said second tail current, said biasing circuit including means for controlling said first output current means and said second output current means to maintain constant the sum of said first tail current and said second tail current;
   a first cascode connected transistor, coupled between said biasing circuit first output current means and said pair of NPN transistors, that supplies said first tail current to said pair of NPN transistors; and
   a second cascode connected transistor, coupled between said biasing circuit second output current means and said pair of PNP transistors, that supplies said second tail current to said pair of PNP transistors.

2. The input stage circuit of claim 1 wherein said first cascode connected transistor is PNP and said second cascode connected transistor is NPN.

3. An operational amplifier input stage circuit having a pair of differential input terminals and positive and negative supply rails connectable to a source of operating power, said circuit comprising:
   a pair of first and second NPN transistors connected as a first long-tailed pair to employ a first tail current;
   a pair of first and second PNP transistors connected as a second long-tailed pair to employ a second tail current;
   first coupling means for coupling the base of said first transistor of said pair of NPN transistors and said first transistor of pair of PNP transistors to said first differential input terminal;
   second coupling means for coupling the base of said second transistor of said pair of NPN transistors and said second transistor of said pair of PNP transistors to said second differential input terminal;
   a biasing circuit including constant current means, first output current means for producing said first tail current, and second output current means, complementary to said first output current means, for providing said second tail current, said biasing circuit including means for controlling said first output current means and said second output current means to maintain constant the sum of said first tail current and said second tail current;
   a first cascode connected transistor, coupled between said biasing circuit first output current means and said pair of NPN transistors, that supplies said first tail current to said pair of NPN transistors;
   a second cascode connected transistor, coupled between said biasing circuit second output current means and said pair of PNP transistors, that supplies said second tail current to said pair of PNP transistors;
   a first clamp transistor, said first clamp transistor having its base coupled to said first differential input terminal through said first means for coupling, having its emitter coupled to said second differential input terminal through said second means for coupling, and having its collector coupled to the collector of said first NPN transistor; and
   a second clamp transistor, said second clamp transistor having its base coupled to said first differential input terminal through said first means for coupling, having its emitter coupled to said second differential input terminal through said second means for coupling, and having its collector coupled to the collector of said first PNP transistor, whereby said first and second clamp transistors actively clamp said differential input terminals.

4. The input stage circuit of claim 3 wherein said first clamp transistor is third transistor is NPN and said second clamp transistor is PNP.

5. An operational amplifier input stage circuit having a pair of differential input terminals and positive and negative supply rails connectable to a source of operating power, said circuit comprising:
   a pair of first and second NPN transistors connected as a first long-tailed pair to employ a first tail current;
   a pair of first and second PNP transistors connected as a second long-tailed pair to employ a second tail current;
   first coupling means for coupling the base of said first transistor of said pair of NPN transistors and said first transistor of pair of PNP transistors to said first differential input terminal;
   second coupling means for coupling the base of said second transistor of said pair of NPN transistors and said second transistor of said pair of PNP transistors to said second differential input terminal;
   a first clamp transistor, said first clamp transistor having its base coupled to said first differential input terminal through said first means for coupling, having its emitter coupled to said second differential input terminal through said second means for coupling, and having its collector coupled to the collector of said first NPN transistor; and
   a second clamp transistor, said second clamp transistor having its base coupled to said first differential input terminal through said first means for coupling, having its emitter coupled to said second differential input terminal through said second means for coupling, and having its collector coupled to the collector of said first PNP transistor,
   whereby first and second clamp transistors actively clamp said differential input terminals.

* * * * *